(12) United States Patent
Johnson (10) Patent No.: US 7,829,912 B2
(45) Date of Patent: Nov. 9, 2010

(54) EFFICIENT CARRIER INJECTION IN A SEMICONDUCTOR DEVICE

(75) Inventor: Ralph H. Johnson, Allen, TX (US)

(73) Assignee: Finisar Corporation, Sunnyvale, CA (US)

( * ) Notice: Subject to any disclaimer, the term of this patent is extended or adjusted under 35 U.S.C. 154(b) by 98 days.

(21) Appl. No.: 11/735,993

(22) Filed: Apr. 16, 2007

(65) Prior Publication Data

US 2008/0023688 A1 Jan. 31, 2008

Related U.S. Application Data

(63) Continuation-in-part of application No. 11/461,353, filed on Jul. 31, 2006.

(51) Int. Cl.
H01L 31/167 (2006.01)
(52) U.S. Cl. ............. 257/101; 257/79; 257/E33.011; 372/43.01; 372/44.01; 372/45.011; 372/45.012; 372/45.013; 372/45.01
(58) Field of Classification Search .......... 372/43.01, 372/44.01, 45.011, 45.012, 45.013, 45.01; 257/79, 101, E33.011
See application file for complete search history.

(56) References Cited

U.S. PATENT DOCUMENTS

| 4,317,085 A | 2/1982 | Burnham et al. |
| 4,466,694 A | 8/1984 | MacDonald |
| 4,660,207 A | 4/1987 | Svilans |
| 4,675,058 A | 6/1987 | Plaster |
| 4,784,722 A | 11/1988 | Liau et al. |
| 4,882,734 A * | 11/1989 | Scifres et al. .......... 372/45.012 |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstein et al. |
| 5,052,016 A | 9/1991 | Mahbobzadeh |
| 5,056,098 A | 10/1991 | Anthony et al. |

(Continued)

FOREIGN PATENT DOCUMENTS

CN 200710126012.9 2/2009

(Continued)

OTHER PUBLICATIONS

Chang et al., "Theoretical and Experimental Analysis on InAlGaAs/AlGaAs Active Region of 850-nm Vertical-Cavity Surface-Emitting Lasers," Journal of Lightwave Technology, vol. 24, No. 1, Jan. 2006.

(Continued)

Primary Examiner—Davienne Monbleau
Assistant Examiner—Eduardo A Rodela
(74) Attorney, Agent, or Firm—Workman Nydegger (57) ABSTRACT

Semiconductor devices such as VCSELs, SELs, LEDs, and HBTs are manufactured to have a wide bandgap material near a narrow bandgap material. Electron injection is improved by an intermediate structure positioned between the wide bandgap material and the narrow bandgap material. The intermediate structure is an inflection, such as a plateau, in the ramping of the composition between the wide bandgap material and the narrow bandgap material. The intermediate structure is highly doped and has a composition with a desired low electron affinity. The injection structure can be used on the p-side of a device with a p-doped intermediate structure at high hole affinity.

18 Claims, 5 Drawing Sheets

U.S. PATENT DOCUMENTS

| | | | |
|---|---|---|---|
| 5,062,115 A | 10/1991 | Thornton | |
| 5,068,869 A | 11/1991 | Wang et al. | |
| 5,079,774 A | 1/1992 | Mendez et al. | |
| 5,115,442 A | 5/1992 | Lee et al. | |
| 5,117,469 A | 5/1992 | Cheung et al. | |
| 5,140,605 A | 8/1992 | Paoli et al. | |
| 5,157,537 A | 10/1992 | Rosenblatt et al. | |
| 5,158,908 A | 10/1992 | Blonder et al. | |
| 5,216,263 A | 6/1993 | Paoli | |
| 5,216,680 A | 6/1993 | Magnusson et al. | |
| 5,237,581 A | 8/1993 | Asada et al. | |
| 5,245,622 A | 9/1993 | Jewell et al. | |
| 5,258,990 A | 11/1993 | Olbright et al. | |
| 5,262,360 A | 11/1993 | Holonyak, Jr. et al. | |
| 5,285,466 A | 2/1994 | Tabatabaie | |
| 5,293,392 A | 3/1994 | Shieh et al. | |
| 5,317,170 A | 5/1994 | Paoli | |
| 5,317,587 A | 5/1994 | Ackley et al. | |
| 5,319,660 A * | 6/1994 | Chen et al. | 372/45.01 |
| 5,325,386 A | 6/1994 | Jewell et al. | |
| 5,331,654 A | 7/1994 | Jewell et al. | |
| 5,331,655 A | 7/1994 | Harder | |
| 5,337,074 A | 8/1994 | Thornton | |
| 5,337,183 A | 8/1994 | Rosenblatt et al. | |
| 5,349,599 A | 9/1994 | Larkins | |
| 5,351,256 A | 9/1994 | Schneider et al. | |
| 5,359,447 A | 10/1994 | Hahn et al. | |
| 5,359,618 A | 10/1994 | Lebby et al. | |
| 5,363,397 A | 11/1994 | Collins et al. | |
| 5,373,520 A | 12/1994 | Shoji et al. | |
| 5,373,522 A | 12/1994 | Holonyak, Jr. et al. | |
| 5,386,426 A | 1/1995 | Stephens | |
| 5,390,209 A | 2/1995 | Vakhshoori | |
| 5,396,508 A | 3/1995 | Bour et al. | |
| 5,404,373 A | 4/1995 | Cheng | |
| 5,412,678 A | 5/1995 | Treat et al. | |
| 5,412,680 A | 5/1995 | Swirhun et al. | |
| 5,416,044 A | 5/1995 | Chino et al. | |
| 5,428,634 A | 6/1995 | Bryan et al. | |
| 5,438,584 A | 8/1995 | Paoli et al. | |
| 5,446,754 A | 8/1995 | Jewell et al. | |
| 5,465,263 A | 11/1995 | Bour et al. | |
| 5,475,701 A | 12/1995 | Hibbs-Brenner | |
| 5,493,577 A | 2/1996 | Choquette et al. | |
| 5,497,390 A | 3/1996 | Tanaka et al. | |
| 5,513,202 A | 4/1996 | Kobayashi et al. | |
| 5,530,715 A | 6/1996 | Shieh et al. | |
| 5,555,255 A | 9/1996 | Kock et al. | |
| 5,557,626 A | 9/1996 | Grodinski et al. | |
| 5,561,683 A | 10/1996 | Kwon | |
| 5,567,980 A | 10/1996 | Holonyak, Jr. et al. | |
| 5,568,499 A | 10/1996 | Lear | |
| 5,574,738 A | 11/1996 | Morgan | |
| 5,574,744 A | 11/1996 | Gaw et al. | |
| 5,581,571 A | 12/1996 | Holonyak, Jr. et al. | |
| 5,586,131 A | 12/1996 | Ono et al. | |
| 5,590,145 A | 12/1996 | Nitta | |
| 5,598,300 A | 1/1997 | Magnusson et al. | |
| 5,606,572 A | 2/1997 | Swirhun et al. | |
| 5,625,729 A | 4/1997 | Brown | |
| 5,642,376 A | 6/1997 | Olbright et al. | |
| 5,645,462 A | 7/1997 | Banno et al. | |
| 5,646,978 A | 7/1997 | Klem et al. | |
| 5,648,978 A | 7/1997 | Sakata | |
| 5,696,023 A | 12/1997 | Holonyak, Jr. et al. | |
| 5,699,373 A | 12/1997 | Uchida et al. | |
| 5,712,188 A | 1/1998 | Chu et al. | |
| 5,724,374 A | 3/1998 | Jewell | |
| 5,726,805 A | 3/1998 | Kaushik et al. | |
| 5,727,013 A | 3/1998 | Botez et al. | |
| 5,727,014 A | 3/1998 | Wang et al. | |
| 5,745,515 A | 4/1998 | Marta et al. | |
| 5,774,487 A | 6/1998 | Morgan | |
| 5,778,018 A | 7/1998 | Yoshikawa et al. | |
| 5,784,399 A | 7/1998 | Sun | |
| 5,818,066 A | 10/1998 | Duboz | |
| 5,828,684 A | 10/1998 | Van de Walle | |
| 5,838,705 A | 11/1998 | Shieh et al. | |
| 5,838,715 A | 11/1998 | Corzine et al. | |
| 5,896,408 A | 4/1999 | Corzine et al. | |
| 5,901,166 A | 5/1999 | Nitta et al. | |
| 5,903,588 A | 5/1999 | Guenter et al. | |
| 5,903,589 A | 5/1999 | Jewell | |
| 5,903,590 A | 5/1999 | Hadley et al. | |
| 5,908,408 A | 6/1999 | McGary et al. | |
| 5,940,422 A | 8/1999 | Johnson | |
| 5,953,362 A | 9/1999 | Pamulapati et al. | |
| 5,959,307 A | 9/1999 | Nakamura et al. | |
| 5,978,401 A | 11/1999 | Morgan | |
| 5,978,408 A | 11/1999 | Thornton | |
| 5,995,531 A | 11/1999 | Gaw et al. | |
| 6,002,705 A | 12/1999 | Thornton | |
| 6,008,675 A | 12/1999 | Handa | |
| 6,014,395 A | 1/2000 | Jewell | |
| 6,043,104 A | 3/2000 | Uchida et al. | |
| 6,055,262 A | 4/2000 | Cox et al. | |
| 6,078,601 A | 6/2000 | Smith | |
| 6,144,682 A | 11/2000 | Sun | |
| 6,154,480 A | 11/2000 | Magnusson et al. | |
| 6,185,241 B1 | 2/2001 | Sun | |
| 6,191,890 B1 | 2/2001 | Baets et al. | |
| 6,208,681 B1 | 3/2001 | Thornton | |
| 6,212,312 B1 | 4/2001 | Grann et al. | |
| 6,238,944 B1 | 5/2001 | Floyd | |
| 6,266,357 B1 | 7/2001 | Feld et al. | |
| 6,269,109 B1 | 7/2001 | Jewell | |
| 6,297,068 B1 | 10/2001 | Thornton | |
| 6,317,446 B1 | 11/2001 | Wipiejewski | |
| 6,320,893 B1 | 11/2001 | Ueki | |
| 6,372,533 B2 | 4/2002 | Jayaraman et al. | |
| 6,411,638 B1 | 6/2002 | Johnson et al. | |
| 6,459,713 B2 | 10/2002 | Jewell | |
| 6,545,335 B1 | 4/2003 | Chua et al. | |
| 6,570,905 B1 | 5/2003 | Ebeling | |
| 6,628,694 B2 | 9/2003 | Deng et al. | |
| 6,700,914 B2 | 3/2004 | Yokouchi et al. | |
| 6,727,520 B2 | 4/2004 | Morgan et al. | |
| 6,782,027 B2 | 8/2004 | Cox et al. | |
| 6,829,283 B2 | 12/2004 | Ebeling | |
| 6,990,135 B2 | 1/2006 | Johnson et al. | |
| 7,026,653 B2 | 4/2006 | Sun | |
| 7,065,124 B2 | 6/2006 | Biard et al. | |
| 7,251,264 B2 | 7/2007 | Johnson et al. | |
| 7,596,165 B2 | 9/2009 | Johnson | |
| 2001/0043629 A1 | 11/2001 | Sun et al. | |
| 2001/0050934 A1 | 12/2001 | Choquette et al. | |
| 2002/0154675 A1 | 10/2002 | Deng et al. | |
| 2003/0123513 A1 | 7/2003 | Villareal | |
| 2003/0123514 A1 | 7/2003 | Cox et al. | |
| 2004/0081215 A1 | 4/2004 | Johnson | |
| 2005/0031011 A1 | 2/2005 | Biard et al. | |
| 2005/0127391 A1* | 6/2005 | Yanamoto | 257/103 |
| 2006/0268954 A1 | 11/2006 | Johnson | |
| 2009/0115346 A1* | 5/2009 | Walter et al. | 315/291 |

FOREIGN PATENT DOCUMENTS

| | | |
|---|---|---|
| CN | 200710126012.9 | 8/2009 |
| DE | 4240706 | 3/1992 |
| EP | 0288184 A2 | 10/1988 |
| EP | 536944 | 4/1993 |
| EP | 0776076 A1 | 5/1997 |
| EP | 3779187.8 | 8/2005 |
| JP | 60123084 | 1/1985 |

| | | |
|---|---|---|
| JP | 02054981 | 2/1990 |
| JP | 5206574 | 8/1993 |
| JP | 5299779 | 11/1993 |
| JP | 10-510100 | 9/1998 |
| JP | 2000294872 | 10/2000 |
| JP | 2002217491 | 8/2002 |
| JP | 2004548434 | 7/2008 |
| KR | 1020057006453.00 | 8/2006 |
| MY | PI20070984 | 2/2010 |
| WO | 9619856 | 6/1996 |
| WO | WO 98/57402 | 12/1998 |
| WO | 02/34630 | 5/2002 |
| WO | WO 02/037630 | 10/2002 |
| WO | 2004/033557 | 4/2004 |
| WO | PCT/US0333611 | 7/2004 |
| WO | WO 2008/016828 | 2/2008 |
| WO | PCT/US/07/074480 | 7/2008 |

OTHER PUBLICATIONS

Chang et al., "The Carrier Blocking Effect on 850 nm InAlGaAs/AlGaAs Vertical-Cavity Surface-Emitting Lasers," Institute of Physics Publishing, Semiconductor Science and Technology, 21, (2006), pp. 1488-1494.

Banwell et al., "VCSE Laser Transmitters for Parallel Data Links", *IEEE Journal of Quantum Electronics*, vol. 29, No. 2, Feb. 1993, pp. 635-644.

Bowers et al., "Fused Vertical Cavity Lasers With Oxide Aperture", Final report for MICRO project 96-042, Industrial Sponsor: Hewlett Packard, 4 pgs, 1996-97.

Catchmark et al., "High Temperature CW Operation of Vertical Cavity Top Surface-Emitting Lasers", CLEO 1993, p. 138.

Chemla et al., "Nonlinear Optical Properties of Semiconductor Quantum Wells", *Optical Nonlinearities and Instabilities Semiconductors*, Academic Press, Inc., Copyright 1988, pp. 83-120.

Choe, et al., "Lateral oxidation of AlAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette, Kent D. et al., Design of Oxide Aperture Profile within Selectively Oxidized VCSELs, IEEE, Conference Proceedings, LEOS '98, 11th Annual Meeting, Orlando, Florida, Dec. 1-4, 1998, pp. 179-180.

Choquette et al., "High Single Mode Operation from Hybrid Ion Implanted/Selectively Oxidized VCSELs", 2000 IEEE 17th International Semiconductor Laser Conference; Monterrey, CA, pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low-Threshold 1.57- µ m VC-SEL's Using Strain-Compensated Quantum Wells and Oxide/Metal Backmirror," IEEE Photonics Technology Letters, vol. 7, No. 5, pp. 444-446, May 1995.

Chua, et al, "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V; San Jose, California, Jan. 28-29, 1998, vol. 3291, pp. 70-71.

Farrier, Robert G., "Parametric control for wafer fabrication: New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings; Dallas, TX, Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modem Dictionary of Electronics*, 6th ed., Indiana: Howard W. Sams & Company, 1984, p. 694.

Guenter et al., "Reliability of Proton-Implanted VCSELs for Data Communications", Invited paper, SPIE, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VCSELs for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.

Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for Photonic Switching & Intership Connections", *Optical Engineering*. vol. 29, No. 3, pp. 210-214, Mar. 1990.

Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs at the AlAs oxide-GaAs interface," Applied Physics Letters, vol. 67, No. 14, pp. 2022-2024, Oct. 2, 1995.

Kishino et al., "Resonant Cavity-Enhanced (RCE) Photodetectors", *IEEE Journal of Quantum Electronics*, vol. 27, No. 8, pp. 2025-2034, Aug. 1991.

Koley B., et al., "Dependence of lateral oxidation rate on thickness of AlAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant Cavity Avalanche Photodiode", *IEEE Photonics Technology Letters*, vol. 3, No. 4, pp. 354-356. Apr. 1991.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251-1252.

Maeda, et al., "Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electo-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", IEEE Photon. Technol. Lett., 11(12), 1536-1538 (1999).

Miller et al., "Optical Bistability Due to Increasing Absorption", Optics Letters, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", IEEE Photonics Technology Letters, vol. 7, No. 5, May 1995, pp. 441-443.

Morgan et al., "High-Power Coherently Coupled 8x8 Vertical Cavity Surface Emitting Laser Array", Appl. Phys Lettrs, vol. 61, No. 10; Sep. 7, 1992, pp. 1160-1162.

Morgan et al., "Hybrid Dielectric/ AIGaAs Mirror Spatially Filtered Vertical Cavity Top-Surface Emitting Laser", Appl. Phys. Letters, vol. 66, No. 10, Mar. 6, 1995, pp. 1157-1159.

Morgan et al., "Novel Hybrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", Electron Lett., vol. 29, No. 2, pp. 206-207, Jan. 21, 1993.

Morgan et al., "Producible GaAs-based MOVPE-Grown Vertical-Cavity Top-Surface Emitting Lasers with Record Performance", Elec. Lett., vol. 31, No. 6, pp. 462-464, Mar. 16, 1995.

Morgan et al., "Progress and Properties of High-Power Coherent Vertical Cavity Surface Emitting Laser Arrays", SPIE, vol. 1850, Jan. 1993, pp. 100-108.

Morgan et al., "Progress in Planarized Vertical Cavity Surface Emitting Laser Devices and Arrays" SPIE, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Vertical-Cavity Surface Emitting Lasers", Honeywell Technology Center, Jun. 6, 1995.

Morgan et al., "Transverse Mode Control of Vertical-Cavity Top-Surface Emitting Lasers", IEEE Photonics Technology Letters, vol. 4, No. 4, Apr. 1993, pp. 374-377.

Morgan et al., "Vertical-cavity surface-emitting laser arrays", Invited Paper, SPIE, vol. 2398, Feb. 6, 1995, pp. 65-93.

Morgan et al., Vertical-cavity surface emitting lasers come of age, Invited paper, SPIE, vol. 2683, 0-8194-2057, Mar. 1996, pp. 18-29.

Morgan, "High-Performance, Producible Vertical Cavity Lasers for Optical Interconnects", High Speed Electronics and Systems, vol. 5, No. 4, Dec. 1994, pp. 65-95.

Naone RL., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting" Electronic Letters, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperture", IEEE Photon. Technol. Lett. 10(8), 1064-1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible-spectrum ($\lambda$ =650nm) photopumped (pulsed, 300 K) laser operation of a vertical-cavity AlAs-AlGaAs/InAlP-InGaP quantum well heterostructure utilizing native oxide mirrors," Applied Physics Letters, vol. 67, No. 8, pp. 1107-1109, Aug. 21, 1995.

S.S. Wang and R Magnusson, "Multilayer Waveguide-Grating Filters", Appl. Opt., vol. 34, No. 14, pp. 2414-2420, 1995.

S.S. Wang and R Magnusson, "Theory and Applications of Guilded-Mode Resonance Filters", Appl. Opt., vol. 32, No. 14, pp. 2606-2613, 1993.

Sah, et al., "Carrier Generation and Recombination in P-N Junctions and P-N Junction Characteristics," Proceedings of the IRE, pp. 1228-1243, Sep. 1957.

Schubert, "Resonant Cavity Light-Emitting Diode", Appl. Phys. Lett., vol. 60, No. 8, pp. 921-923, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, Optics Letters, vol. 21, No. 15, Aug. 1, 1996, pp. 1201-1203.

Spicer, et al., "The Unified Model for Schottky Barrier Formation and MOS Interface States in 3-5 Compounds," Applications of Surface Science, vol. 9, pp. 83-101, 1981.

Sugimoto, M., et al. "Very Low Threshold Current Density in Vertical-Cavity Surface-Emitting Laser Diodes with Periodically Doped Distributed Bragg Reflectors," Electronic Letters, IEE Stevenage, GB, vol. 28, No. 4, 1992.

Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11; Nov. 1, 1994, pp. 1971-1975.

Tao, Andrea, "Wet-Oxidation of Digitally Alloyed AlGaAs," National Nanofabrication Users Network, Research Experience for Undergraduates 2000, 2 pages.

Tatum, et al., Commerialization of Honeywell's VCSEL Technology, Published in Proceedings of the SPIE, vol. 3946, SPIE, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan Appl. Phys. vol. 33 (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Threshold Current Vertical Cavity Surface Emitting Lasers Obtained with Selective Oxidation", Elect. Lett., vol. 31, No. 11, pp. 886-888, May 25, 1995.

Yablonovitch et al., "Photonic Bandgap Structures", J. Opt. Soc. Am. B., vol. 10, No. 2, pp. 283-295, Feb. 1993.

Young et al., "Enhanced Performance of Offset-Gain High Barrier Vertical-Cavity Surface-Emitting Lasers", IEEE J. Quantum Electron., vol. 29, No. 6, pp. 2013-2022, Jun. 1993.

U.S. Appl. No. 11/461,353, mailed Oct. 18, 2007, Office Action.

U.S. Appl. No. 11/461,353, mailed Jun. 18, 2008, Final Office Action.

U.S. Appl. No. 11/461,353, mailed Jan. 6, 2009, Office Action.

U.S. Appl. No. 11/461,353, mailed Jul. 8, 2009, Office Action.

* cited by examiner

EFFICIENT CARRIER INJECTION IN A SEMICONDUCTOR DEVICE

CROSS-REFERENCE TO RELATED APPLICATIONS

This application is a continuation-in-part of U.S. patent application Ser. No. 11/461,353, filed on Jul. 31, 2006, entitled "Light Emitting Semiconductor Device Having Electrical Confinement Barrier Near The Active Region," which is herein incorporated by reference in its entirety.

BACKGROUND OF THE INVENTION

1. Field of the Invention

The invention generally relates to semiconductor devices such as semiconductor lasers, light emitting diodes, and heterojunction bipolar transistors. More specifically, the invention relates to efficient injection of electrons or holes from a wider bandgap semiconductor material to a narrower bandgap semiconductor material.

2. Related Technology

Vertical cavity surface emitting lasers (VCSELs), surface emitting lasers (SELs), light Emitting Diodes (LEDs), and heterojunction bipolar transistors (HBTs) are becoming increasingly important for a wide variety of applications including optical interconnection of integrated circuits, optical computing systems, optical recording and readout systems, and telecommunications.

VCSELs, SELs, and LEDs are generally formed as a semiconductor diode. A diode is formed from a junction between a p-type material and an n-type material. In VCSELs, the p-type semiconductor material is most often aluminum gallium arsenide (AlGaAs) doped with a material such as carbon that introduces free holes or positive charge carriers, while the n-type semiconductor material is typically AlGaAs doped with a material, such as silicon, that introduces free electrons, or negative charge carriers.

The PN junction forms an active region. The active region typically includes a number of quantum wells. Free carriers in the form of holes and electrons are injected into the quantum wells when the PN junction is forward biased by an electrical current. At a sufficiently high bias current, the injected minority carriers form a population inversion in the quantum wells that produces optical gain, which is used inside a resonant cavity to cause lasing. The resonant cavity is formed by properly spacing mirrors on either side of the active region.

Free carriers that escape the quantum wells into the surrounding semiconductor material and recombine there do not contribute to the optical gain. These events are parasitic currents that generate heat and reduce the efficiency of the light emitting device. This "carrier leakage" is one of the causes of the rollover of the light vs. current curve. Current can only be increased so much and then light output reaches a maximum and drops off. Generally, higher temperatures result in lower maximum light output partially because the thermal energy of the carriers, electrons, and holes is increased allowing a larger fraction to contribute to carrier leakage. Electrical confinement in the active region can be particularly problematic in VCSEL devices, which tend to require high current densities for operation and is made worse in the highest frequency VCSELs where the highest current densities are used.

To improve current confinement, most semiconductor lasers have confining layers next to the active region. The confining layers have a bandgap that is substantially wider than the bandgap of the quantum wells and quantum well barriers. For carriers to escape from the active region, the carriers need higher energy to pass through the confining layer. The higher energy requirements in the confining layer make it more likely that carriers will remain in the active region and contribute to stimulated emission at the desired wavelength.

One potential concern with confining electrons in the active region is the effect that the confining layer has on the injection of carriers into the active region. In some cases, measures taken to confine carriers in the active region can also decrease the efficiency of injecting the carriers into the active region.

BRIEF SUMMARY OF THE INVENTION

The present invention relates to improving the electron or hole injection efficiency of semiconductor devices such as VCSELs, SELs, LEDs, and HBTs that have a wide bandgap material adjacent or near a narrow bandgap material. (e.g., a high aluminum confining region near a low aluminum active region in an AlGaAs or AlInGaAs system). The wide bandgap material is separated from the narrow bandgap material by a transition region that provides ramping of the composition between the two regions. The carrier injection efficiency is improved by creating a point of inflection, (e.g. a plateau) in the composition ramping in the transition region. The inflection in the composition ramping is both doped and positioned at a composition with a desired low level of electron affinity (or high level of hole affinity for hole injection, where hole affinity is defined as the sum of the electron affinity and the bandgap energy). The combination of doping and low electron affinity at or near the composition inflection improves the electron injection. The improvement in electron or hole injection occurs because the portion of the transition region that ramps from the inflection to the narrow bandgap material (e.g. the quantum wells) is effectively modulation doped by the dopant in the material with low electron affinity (or high hole affinity).

The semiconductor devices of the present invention can be manufactured from any type of semiconductor suitable for forming junctions of wide bandgap and narrow bandgap material. Examples of suitable materials include III-V semiconductor materials (e.g. GaAs and/or InP based materials) and type IV materials such as SiGe.

In one embodiment, the semiconductor device can include an active region having one or more quantum wells and one or more quantum well barriers. Electrical confining layers sandwich the active region and provide optical gain efficiency by confining carriers to the active region. The confining layers have a region of high energy band gap which in the case of many III-V compounds translates to a high aluminum content (e.g., 70%-100% Al for the type III material). The aluminum content is selected to give the material a relatively wide bandgap, as compared to the bandgap in the quantum well barriers of the active region. The wide bandgap material gives the confining layer good carrier confinement and increases the efficiency in the active region. In an exemplary embodiment, the high aluminum region also includes an increase in doping. The confining layer can be doped with a p-type or n-type dopant depending on whether the confinement barrier is on the n-side or p-side of the active region.

A transition region for improving injection of electrons into the active region is positioned between the high aluminum content region and the outer quantum well barrier of the active region. In one embodiment, the transition region is manufactured from a III-V semiconductor material that includes aluminum, although other semiconductor materials can be used. The aluminum content in the transition region is ramped from the aluminum content in the quantum well barrier to the aluminum content in the high aluminum content confining region. If a non-aluminum material is used, the ramping is a ramping of the semiconductor component or components that widen the bandgap. For example, in a GaAsP system, the P content can be ramped (with a decrease in As); in a SiGe system the Si content can be ramped.

To improve the injection of electrons from the confining region (i.e., a high bandgap semiconductor material) to the quantum well barriers (i.e., a lower bandgap material), the transition region includes a doped intermediate structure in the transition between the active region and the confining region. The intermediate structure is doped, for example, with a donor doping of about 1e18/cm$^3$. The doped intermediate structure is configured to have low electron affinity for n-type doping or high hole affinity for p-type doping.

In one embodiment, the intermediate structure can be described as an inflection in the ramping of the semiconductor composition (e.g. aluminum content). An inflection in the ramping occurs where the rate of ramping of the composition (from the active region toward the confining region) is increasing, then increases to a lesser degree, and then increases again (the ramping could similarly be described as a decrease in composition from the confining region toward the active region). A plateau in composition content can be created by decreasing the rate of ramping to zero over a particular depth of growth and then once again increasing the rate of ramping. A non-planar structure can be created by decreasing the rate of ramping to something greater than zero for a particular depth of growth. In one embodiment, the non-planar intermediate structures of can be linear or curved or a combination of these. In one embodiment, the intermediate structure is a flattening in the composition ramping for a depth of at least 5 nm, more preferably at least about 20 nm.

The composition at which the inflection is formed is selected to provide a low electron affinity structure. Electron affinity is a property of the semiconductor material. In some III-V semiconductor materials that include aluminum, electron affinity generally decreases with increasing aluminum until a minimum is reached and then electron affinity increases with increasing aluminum.

Forming the doped intermediate structure (i.e., the plateau or point of inflection) at or near the electron affinity minimum (or hole affinity maximum) improves the carrier injection efficiency of the device. The composition that gives a minimum or nearly a minimum depends on the particular semiconductor material being used. In one embodiment the intermediate structure comprises AlGaAs and the intermediate structure has an aluminum content of between about 0.4 to about 0.7. Alternatively, the intermediate structure comprises AlInGaP and the intermediate structure has an aluminum content between about 0.5 and 0.8. In another embodiment, the intermediate structure comprises GaAsP and the P content is between 0.4 and 0.6 (of the type V material). In yet another embodiment, the intermediate structure comprises SiGe and the Si content is between about 0.2 and 0.5.

The doping in the intermediate structure coupled with the low electron affinity (or high hole affinity) allows the intermediate structure to be a good carrier source to modulation dope the lower bandgap regions effectively (e.g. the active region and the ramp to the active region). The low electron affinity electron source in the intermediate structure provides low resistance electron conduction through the transition region. Facilitating carrier injection allows wider bandgap materials to be used in the confining layer without significantly reducing carrier injection into the active region. The improved confinement and/or improved carrier injection leads to a higher percentage of carriers recombining in the quantum wells where they provide the desired optical emission or optical gain.

In addition to the intermediate structure, the transition region can optionally include a substantially undoped portion. The undoped portion is positioned between the doped intermediate structure and the active region. Additional details regarding an un-doped portion adjacent an active region are described in U.S. Pat. No. 7,023,896, which is hereby incorporated herein by reference.

In one alternative embodiment, the high aluminum confining region can be made thin (e.g., between 5 and 100 nm thick), thereby forming a confinement barrier. With sufficiently high aluminum in the confinement barrier, the aluminum content in the adjacent layer (i.e., the spacer layer) can be lowered (e.g., to less than 40%) while maintaining or improving the confinement of free carriers in the active region. The thinness of the confinement barrier can minimize vertical resistance and improves the manufacturability of the epitaxial structure. High aluminum content material typically requires higher temperatures for crystal growth. The higher temperatures can be difficult to work with and can degrade other semiconductor layers or cause imperfections in the crystal lattice. By making the confining layer thin, many of these problems are avoided or minimized.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings, in which.

DETAILED DESCRIPTION OF EXEMPLARY EMBODIMENTS

The present invention relates to semiconductor devices such as VCSELs, SELs, LEDs, and HTJs having an injection structure adjacent to the active region that improves the injection of electrons or holes from a wide bandgap semiconductor material into a narrower bandgap material of the active region.

For purposes of this invention, the term "substantially undoped" includes, but is not limited to, materials that have a minor amount of unintentional doping (e.g. unintentional doping that occurs by diffusion or other means).

For purposes of this invention, the term "hole affinity" is defined as the sum of the electron affinity and the energy bandgap.

For purposes of this invention, the content of Al in an AlGaAs or an AlGaInP system refers to the percent of Al in the AlGa fraction.

For purposes of this invention, the content of P in a GaAsP system refers the percent of P in the AsP fraction.

Various aspects of the present invention will now be illustrated in the context of a VCSEL. However, those skilled in the art will recognize that the features of the present invention can be incorporated into other light emitting semiconductor devices that have an active region, including but not limited to SELs and LEDs.

Figure 1:
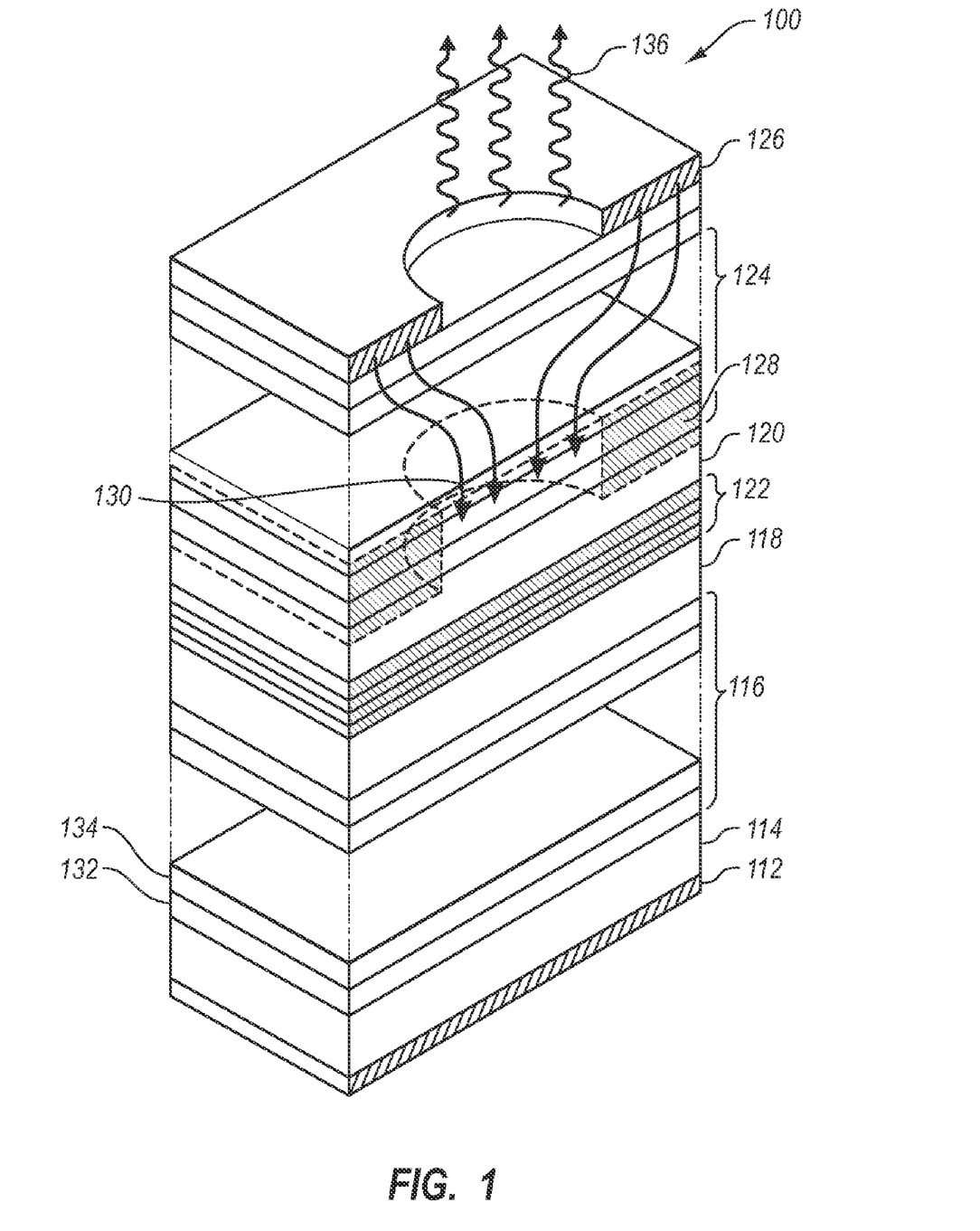
FIG. 1 is an illustration of an exemplary vertical cavity surface emitting laser according to the present invention.

FIG. 1 shows a planar, current-guided, vertical cavity surface emitting laser (VCSEL) 100 having periodic layer pairs for top and bottom Bragg mirrors. A substrate 114 is formed on a bottom contact 112 and is doped with a first type of impurities (i.e., p-type or n-type dopant). A bottom mirror stack 116 is formed on substrate 114 and a bottom confining layer 118 is formed on bottom stack 116. The bottom confining layer 118 and a top confining layer 120 sandwich an active region 122. An upper mirror stack 124 is formed on the top confining layer 120. A metal layer 126 forms a contact on a portion of stack 124.

An isolation region 128 restricts the area of the current flow 130 through the active region 122. Region 128 can be formed by an ion implantation and/or oxidation.

Stacks 116 and 124 can be distributed Bragg reflector (DBR) stacks, and include periodic layers (e.g., 132 and 134). Periodic layers 132 and 134 are typically AlGaAs and AlAs, respectively, but can be made from other III-V semiconductor materials. Stacks 116 and 124 can be doped or undoped and the doping can be n-type or p-type depending on the particular VCSEL, SEL, or LED design. Various portions of the present discussion may refer to several configurations of the device.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through stack 124. Those skilled in the art will recognize that other configurations of contacts can be used to generate a voltage across active region 122 and generate light 136.

Figure 2:
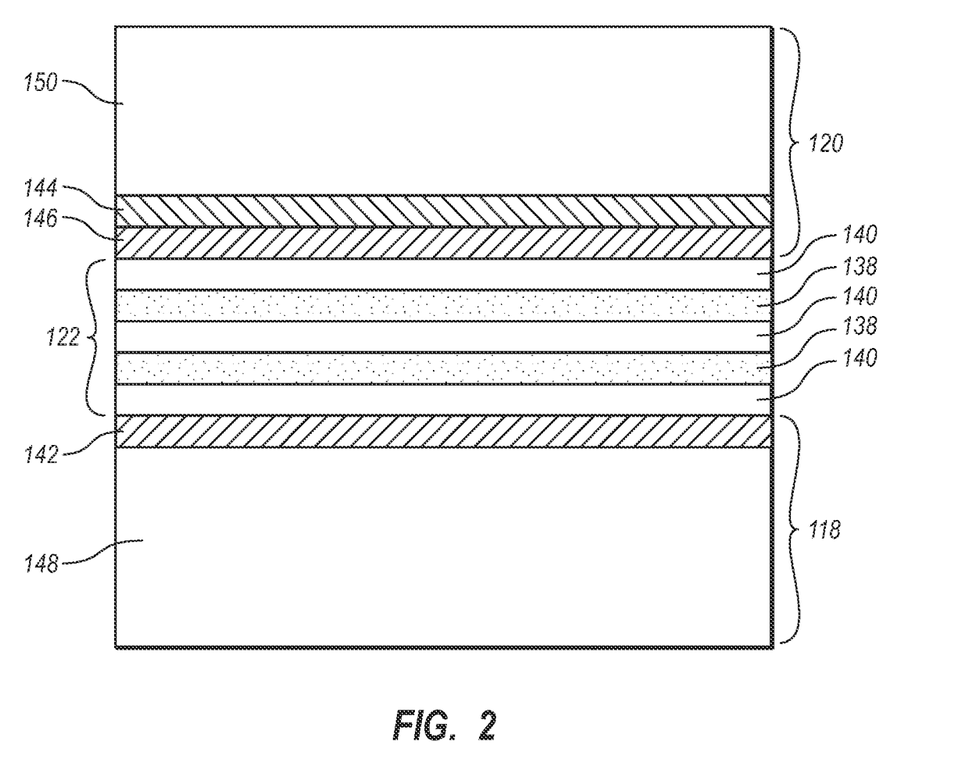
FIG. 2 illustrates the confining layers and active region of the laser of FIG. 1 in more detail.

FIG. 2 illustrates the active region 122 and confining layers 118 and 120. Active region 122 is formed from one or more quantum wells 138 that are separated by quantum well barriers 140. In one embodiment, confining layers 118 and 120 include high aluminum content regions 142 and 144, respectively. The high aluminum content regions provide good carrier confinement in active region 122.

Confining region 120 includes a transition region 146 that is positioned between active region 122 and high aluminum content region 144. As discussed below, the combination of high aluminum content region 144 and the transition region 146 provide an injection structure with good carrier confinement and good electron injection.

Depending on the design of the device and the thickness of high aluminum content regions 142 and 144, the confining regions 118 and 120 can optionally include spacer layers 148 and 150, respectively. The thickness of spacer layers 148 and 150 is dependent upon the kind of device being fabricated. In a vertical cavity resonant device such as a VCSEL, or VECSEL the spacer layers provide resonant spacing between mirrors and provide that the quantum wells of the active region are centered on a peak of the optical field. In LEDs, spacer layers 148 and 150 can simply connect the injection structure to the remainder of the device and/or provide another function of the device.

The confining layers 118 and 120 and active region 122 are formed from one or more types of semiconductor materials. Examples of suitable semiconductor materials include GaAs, AlAs, InP, AlGaAs, InGaAs, InAlAs, InGaP, AlGaAsP, AlGaInP, InGaAsP, InAlGaAs, SiGe, or the like.

The various layers and regions in the semiconductor devices of the invention are created, at least in part, by varying the composition of the semiconductor material. For example in one embodiment, the aluminum content of a III-V semiconductor material can be varied. In one embodiment, the semiconductor material is $Al_xGa_{1-x}As$, where x is between 0.0 and 1.0 (i.e., aluminum is 0.0% to 100%). $Al_xGa_{1-x}As$ is useful for making 850 nm VCSELs, which require high current densities and high optical output. In an alternative embodiment, the semiconductor material is $(Al_xGa_{1-x})InP$ where x is between 0.0 and 1.0 (i.e., aluminum is 0.0% to 100% for the AlGa fraction). The ratio of In to AlGa is typically selected to provide lattice matching and/or to provide a desired bandgap. In one embodiment the fraction of In the AlGaInP system is about 0.51 of the type III materials.

Figure 3:
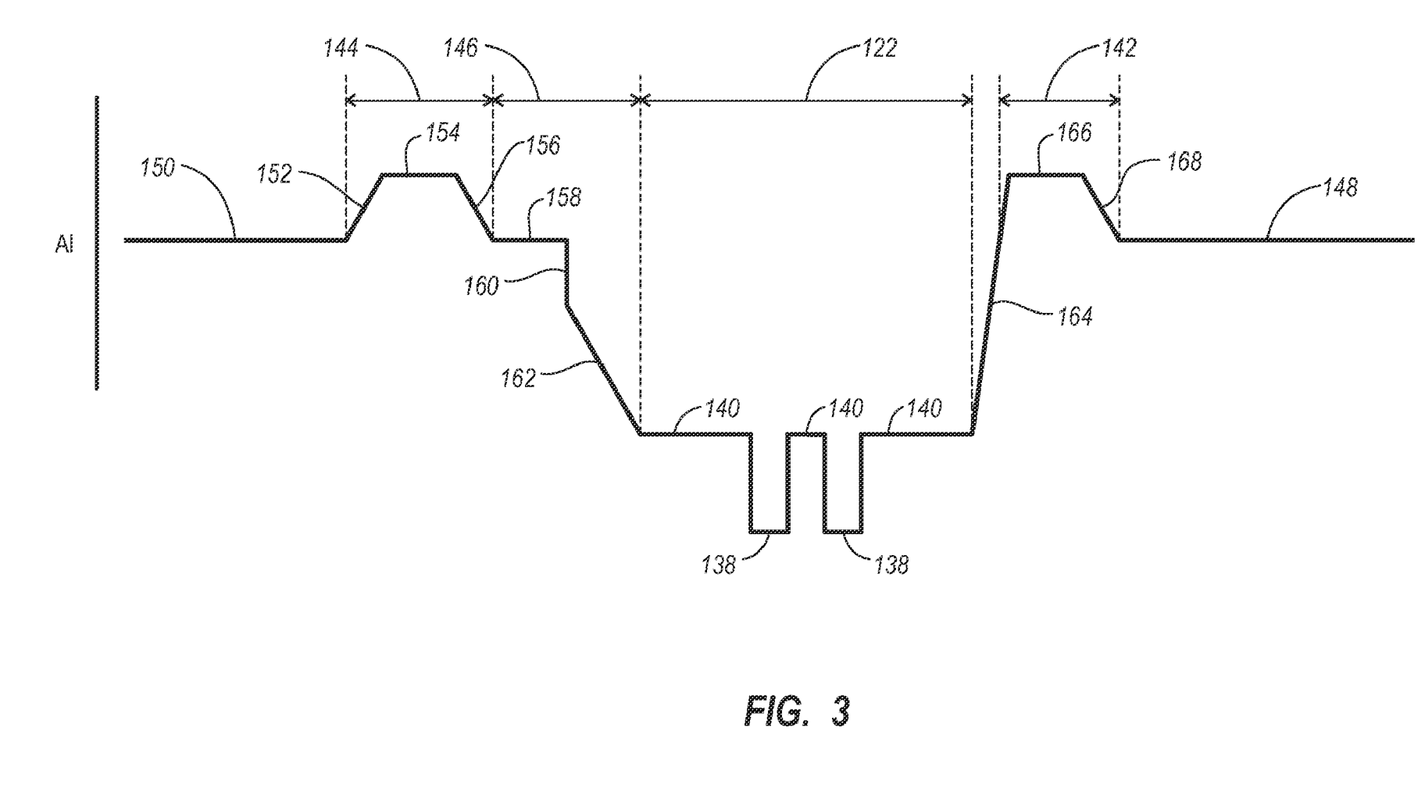
FIG. 3 is a diagram of the aluminum profile of a semiconductor device according to the present invention.

The electron injection structure can be illustrated by showing the aluminum composition for the various layers and regions of the semiconductor device. FIG. 3 shows the aluminum content in an example device according to one embodiment of the invention. The aluminum content is shown for active region 122, high aluminum confining regions 142 and 144, and transition region 146.

Beginning with spacer 150, the aluminum content in a spacer layer 150 increases at ramp 152 to a maximum aluminum content 154 within high aluminum region 144. In transition region 146, the aluminum content ramps between the maximum aluminum content 154 and the aluminum content of quantum well barrier 140. Transition region 146 includes a ramp 156, an intermediate structure 158, a step 160, and a ramp 162. The active region 122 includes several steps that form quantum wells 138. A ramp 164 provides a transition between active region 122 and high aluminum content region 142. Ramp 168 provides a transition between the aluminum content of spacer 148 and a maximum aluminum content 166 in high aluminum region 142. The confinement of carriers and efficient electron injection are provided by particular features of the high aluminum regions 142 and 144 and the transition region 146, as discussed below.

A. Transition Region

Transition region 146 is configured to provide efficient electron injection of electrons in the high aluminum confining region 144 into the active region 122. The transition region 146 includes an intermediate structure with low electron affinity. The low electron affinity and high doping give a high conduction band and allow the n-type dopants in the region to provide modulation doping to the adjacent region.

The transition region 146 includes an intermediate structure. In FIG. 3, the intermediate structure is a plateau 158 in the ramping of the aluminum. However, the intermediate structure is not limited to a plateau. The intermediate structure can be any inflection in the ramping of the composition between the narrow bandgap material and the wide bandgap material. An inflection in the ramping is provided where the rate of ramping of aluminum (from the active region toward the confining region) is increasing, then increases to a lesser degree, and then increases again (the ramping could similarly be described as a decrease in aluminum from the confining region toward the active region). A plateau in aluminum content is provided by flattening the ramping of aluminum to zero or near zero over a particular depth of growth and then once again increasing the rate of ramping. The invention also includes non-planar intermediate structures that are formed by flattening the ramping to something greater than zero for a particular depth of growth. In one embodiment, the non-planar intermediate structures of aluminum can be linear or curved or a combination of these. In one embodiment, the intermediate structure is a flattening in the composition ramping for a depth of at least 5 nm, more preferably at least about 20 nm.

The composition (i.e., the content of aluminum) at which the inflection is formed is selected to provide a low electron affinity structure. Electron affinity is a property of the semiconductor material. In some III-V semiconductor materials with aluminum, electron affinity generally decreases with increasing aluminum until a minimum is reached and then electron affinity increases with increasing aluminum.

Figure 4:
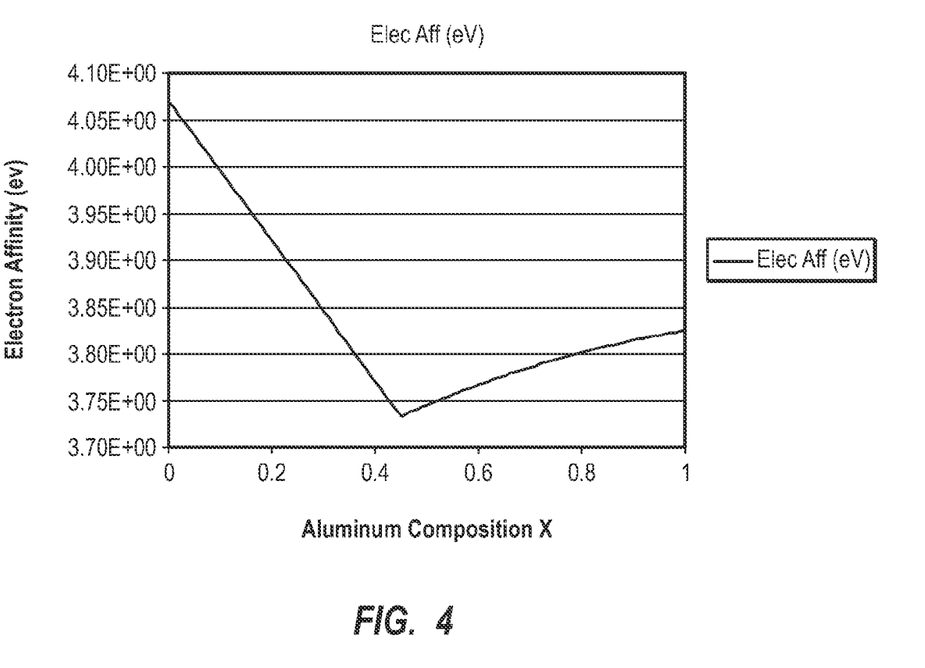
FIG. 4 is a graph showing the electron affinity for an AlGaAs material.

FIG. 4 shows electron affinity for an AlGaAs system with varying amounts of aluminum. As can be seen in the graph of FIG. 4, in an AlGaAs system, electron affinity decreases substantially with increasing aluminum until a minimum electron affinity is reached at about 45% aluminum. Increasing the aluminum past about 45% results in higher electron affinity.

The aluminum content of the intermediate structure is selected such that the electron affinity in the intermediate structure is lower than the electron affinity in both the active region and the high aluminum region. An intermediate structure with low affinity improves the electron injection of the device. The particular aluminum content of the intermediate structure will depend on the particular semiconductor material used to make the device, the minimum electron affinity of that semiconductor material, the aluminum content in the quantum well barriers of the active region, and the aluminum content in the high aluminum content region. In one embodiment the aluminum content is in a range from about 35% to about 80% (of Al in AlGa). In an alternative embodiment, the aluminum composition of the intermediate structure is selected to be within a desired percentage of aluminum from the electron affinity minimum. In one embodiment the aluminum composition is within about 20% of the minimum, more preferably within about 15% of the minimum, and most preferably within about 10% of the minimum.

More specifically, for an $Al_xGa_{1-x}As$ the aluminum composition can be in a range of about 0.35<X<0.7, more preferably about 0.4<X<0.65. For an $(Al_xGa_{1-x})InP$ system the electron affinity minimum is at an Al content of 0.7. Preferred ranges for the aluminum content of the intermediate structure in this system can be in a range from 0.5<X<0.75, more preferably about x=0.7.

Figure 5:
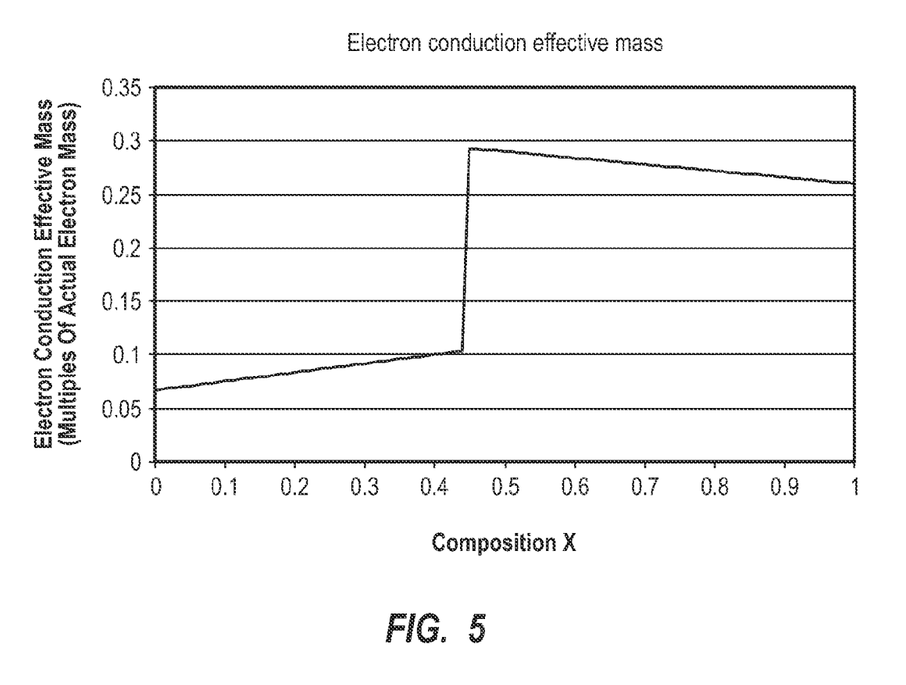
FIG. 5 is a graph showing electron conduction effective mass vs. aluminum content in AlGaAs.

In some materials, the aluminum composition that gives a minimum electron affinity may not be the most preferred composition due to undesired side effects. For example, in an AlGaAs system, the minimum electron affinity occurs at an aluminum composition that is known to have DX centers that reduce electron conduction. FIG. 5 is a graph showing electron conduction band effective mass vs. aluminum composition for AlGaAs. The DX center phenomenon occurs in compositions close to the jump in the electron effective mass at x=0.45, but decreases significantly at slightly higher or lower aluminum compositions. Consequently, in some embodiments, it can be desirable to select an aluminum composition that maximizes electron conductance while minimizing electron affinity. In an AlGaAs system, an aluminum content of between about 50% and 60% can be used.

Alternatively, the issue with DX centers can be resolved by reducing the poor conduction caused by DX centers using techniques known in the art, such as the addition of light to stimulate carriers out of the DX centers. In yet another embodiment, a III-V semiconductor material that does not have DX centers near the electron affinity minimum can be used. For example, AlGaInP is not known to have DX centers at an aluminum composition near the electron affinity minimum.

The transition region 146 includes ramps and/or steps on either side of the intermediate structure 158 to achieve continuous ramping between the active region 122 and high aluminum region 144. FIG. 3 shows ramp 156, a ramp 162, and a step 160 to achieve this continuous ramping. In one embodiment, step 160 can be advantageous to avoid compositions that are prone to DX centers. However, a step is not required and in one embodiment, ramp 162 can extend between intermediate structure 158 and quantum well barrier 140.

Ramp 162 can serve multiple purposes. In one respect, ramp 162 provides a low carrier and charge region adjacent the quantum wells for the residual field to drop. The rate of change of the bandgap is large in ramp 162 to provide a substantial portion of the hole confinement. In one embodiment, a portion of ramp 162 can be substantially undoped. The undoped portion typically extends from the quantum well to a composition less than 45% aluminum. The undoped portion of ramp 162 can provide a region for the residual voltage to drop.

Another feature of the intermediate structure 158 is the use of doping. In one embodiment the doping is at least about $5e18/cm^3$, more preferably $2e18/cm^3$. The doping in the intermediate structure coupled with the low electron affinity allows the intermediate structure to be a good electron source to modulation dope the lower Al regions effectively (e.g. ramp 162 and active region 122). The low electron affinity electron source in the intermediate structure provides low resistance electron conduction through the transition region. By achieving low resistance electron conduction, the electric field that would otherwise be induced by the resistive drops, is reduced, thereby enhancing hole confinement.

B. Wide Bandgap Region

The electronic devices of the present invention include one or more regions of wide bandgap material (e.g., high aluminum content regions such as regions 142 and 144), also referred to as a "confining region." The high aluminum confining regions 142 and 144 advantageously provide confinement for free carriers in the active region. Device 100 typically includes a high aluminum confining region above and below the active region to confine holes and electrons (i.e., regions 142 and 144). However, the invention includes devices with only one high aluminum content region. Where two high aluminum regions are provided, the aluminum content can be the same or different in the different regions.

The high aluminum confining regions 142 and 144 can extend any thickness. In one embodiment, the thickness of the confining regions is limited to minimize the vertical resistance of the device and facilitate manufacturability. The high aluminum confining regions can be less than 100 nm, more preferably less than 50 nm. In a preferred embodiment, the thickness of confining region is less than about 50 nm, and more preferably about 20 nm. Alternatively, the thickness of the confining layer is in a range from about 2 nm to about 50 nm, more preferably in a range from about 5 nm to about 30 nm, and most preferably between 8 nm and 30 nm.

In a preferred embodiment, the aluminum content in the high aluminum confining regions 142 and 144 is in a range from about 60% to about 100%, more preferably between about 70% and 100%. For oxide confined lasers it can be advantageous to have an aluminum content in the confining regions 142 and 144 that is less than 100% to avoid undesired oxidation. In this embodiment, the aluminum content in the confining regions is preferably in a range from 60% and 90%, more preferably about 85%.

In one embodiment, the confining regions 142 and 144 can be described according to the differential in aluminum content between the confining region and the adjacent spacer layer. In a preferred embodiment, the percentage of aluminum content in the confining layer is greater by at least about 15%, more preferably greater by at least about 20%, and most preferably greater by at least about 25% (e.g. the spacer layer has 40% Al and the confinement barrier has 65% Al).

In one embodiment of the present invention, the high aluminum confining regions 142 and 144 include a doping spike in addition to the aluminum spike. The doping spike is preferably in a range from about $5\times10^{17}$ to about $1\times10^{19}$ on the n-side of the active region and preferably in a range from about $5\times10^{17}$ to about $6\times10^{18}$ in the confining region on the p-side of the active region. Most preferably the doping in either confining region is in a range from about $1\times10^{18}$ to about $3\times10^{18}$. Similar to the aluminum spike, the doping spike in the confining region can be selected relative to the dopant level in the spacer layer. In an exemplary embodiment, the dopant level in the spacer layer is in a range from about $1\times10^{17}$ to about $1\times10^{18}$. In a preferred embodiment, the dopant in the confinement barriers is between about 1.5 and 8 times greater than in the spacer layers, more preferably between about 1.5 and 4 times greater than in the spacer layer.

The high aluminum confining region can be particularly advantageous for device operation at high temperature and/or high bias currents where minority carrier confinement may be lost. Loss of confinement is undesirable because it decreases the efficiency of the light emitting semiconductor device. With n-doping in the confinement barrier layer, the full bandgap delta of the AlGaAs or similar material may be extended into the valence band providing excellent hole confinement. A confining region thickness of 2 nm to 20 nm, more preferably 8 nm to 10 nm should be sufficient to confine the holes. Thus, the minority carriers injected into the quantum well region may be contained in that region by the presence of the confining region (i.e., a hole barrier confines holes and an electron barrier confines electrons). The loss of free carrier confinement can be dramatically reduced or even eliminated.

C. Spacer Layer

In VCSELs, an $Al_{.65}Ga_{.35}As$ can normally be used in the spacer layer to provide a large barrier to free carriers in the valence band which ensures good confinement at high bias levels and high temperature, but has an undesirable indirect bandgap. This gives relatively low electron mobility and high vertical series resistance for a given doping level in the n-spacer.

Optionally, spacer layer 148 and/or spacer layer 150 of device 100 can have an aluminum composition less than 45% (e.g., 0.39 or 0.16), which can benefit the device in several ways. First, the graded region between the Bragg mirror and spacer can be replaced with a step in composition to an alloy with the same electron affinity as the mirror layer. This reduces the barrier to electron flow found in previous designs using the linear grade in aluminum composition and result in a reduction in series resistance. The spacer layer can then be a direct bandgap semiconductor. The scattering of majority carriers from the indirect X conduction band to the direct Γ conduction band now occurs at the Bragg mirror rather than near the quantum wells.

Second the fact that the spacer is a direct bandgap material gives it a much higher electron mobility. Therefore, a given series resistance can be obtained with a much lower donor doping concentration. This reduces the free carrier absorption close to the quantum wells where the E-field standing wave has the highest amplitude. Decreased free carrier absorption can improve the efficiency of the VCSEL.

D. Example Compositions

Figure 6:
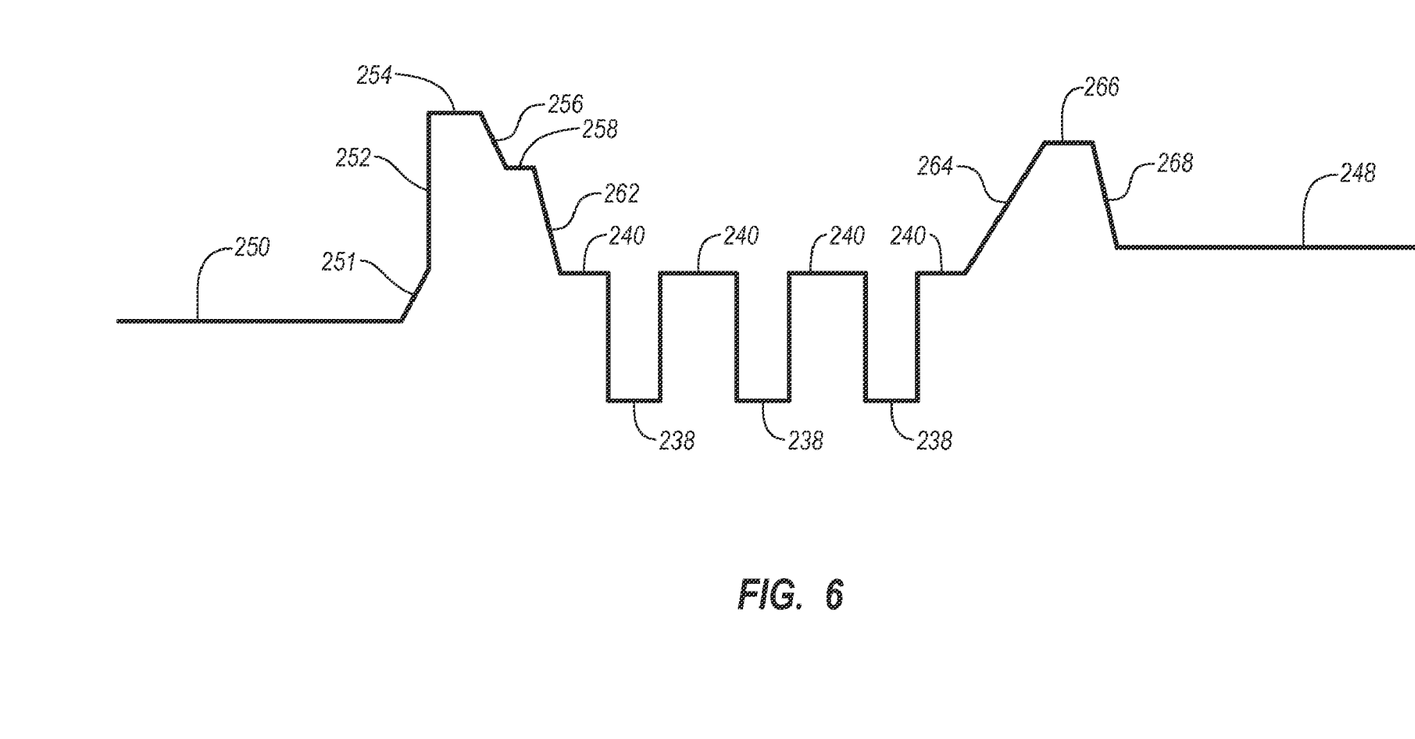
FIG. 6 is a diagram of the aluminum profile of another example semiconductor device according to the present invention.

FIG. 6 illustrates an example composition of $Al_xGa_{1-x}As$ where the aluminum content is varied to form an active region and confining layers above and below the active region. The device includes high aluminum content regions 254 and 266 in the n- and p-confining layers and an inflection 258 in the aluminum ramping on the n side. Beginning with spacer 250, spacer 250 has as an aluminum composition between 10% and 20% (i.e., x is between 0.1 and 0.2) and is doped n-type at 2e16-5e17/cm³. The lower spacer is followed by a linear ramp 251 to 25% where the doping is ramped from that of the spacer to about 2e18/cm³ n-type with a linear ramp which is about 10 nm thick. This is followed by a step at 252 to about 85% aluminum. The 85% layer 254 is doped about 2e18/cm³ n-type and has a thickness between 12 nm and 25 nm. This is followed by a linear ramp 256 in composition to about 65% which is 5 nm with a doping of 2e18/cm³ n-type. This is followed by a 10 nm region 258 of 65% which is n-doped at 2e18/cm³. This is followed by a substantially undoped linear ramp 262 with a length of 15 nm from 65% to 25%. This is followed by the quantum well active region with quantum wells 238 and barriers 240. The p-side begins with a 3e18/cm³ p-doped ramp 264 which is about 7.5 nm thick to a composition of 85%. The 85% layer 266 is from 2e18/cm³ p-doped and is about 20 nm thick. This is followed by a 20 nm ramp 268 at a doping starting at 2e18/cm³ ramping to about 5e17/cm³ with a final composition which matches the p-spacer 248. The p-spacer has a composition of between 10% and 20% and a doping of 5e17/cm³ p-type.

The present invention also includes semiconductor materials where the bandgap is engineered using a composition that does not contain aluminum. Suitable non-aluminum materials include semiconductor materials where the electron affinity minimum is at a composition other than where the energy band gap maximizes. In these materials, a transition region having an intermediate structure (e.g., an inflection in the ramping of the composition) can be used to improve carrier injection. Examples of suitable non-aluminum systems include GaAsP and SiGe.

Where aluminum is not used, the content of another element (e.g., P or Si) is varied in the composition to obtain the wide bandgap and narrow bandgap materials. In addition, the ramping in the transition region is a ramping of the content of this element (e.g., P or Si) rather than aluminum. The non-aluminum compositions can have an electron affinity minimum or a hole affinity maximum at a particular fraction of the element being varied. In one embodiment, the intermediate structure is placed at or near the electron affinity minimum or the hole affinity maximum for these materials. Preferably the content of the varied element (e.g., P, Si, or Al) in the intermediate structure is within about 20% of the content that gives the electron affinity minimum or the hole affinity maximum, more preferably within at least about 15%, even more preferably within at least about 10%, and most preferably within at least about 5%. For purposes of this invention, the forgoing percentages refer to the fraction of the components that are varied to achieve a wideband and a narrow bandgap in the semiconductor material.

In a $GaAs_{1-x}P_x$ system, the composition can be ramped between the narrow bandgap material and the wide bandgap material by adjusting the content (i.e., the fraction x) of P. In the narrow bandgap material (e.g., the active region) the content of P can be between about 0.0 and 0.5; in the wide bandgap material (e.g., the confining region) the content of P can be between about 0.7 and 1.0; and the intermediate structure can have a content of P between about 0.5 and 0.7.

For a $Si_xGe_{1-x}$ system, the composition can be ramped between the narrow bandgap material and the wide bandgap material by adjusting the content (i.e., the fraction x) of Si. In the narrow bandgap material (e.g., the active region) the content of Si can be between about 0.0 and 0.2; in the wide bandgap material (e.g., the confining region) the content of Si can be between about 0.5 and 1.0; and the intermediate structure can have a content of Si between about 0.2 and 0.5.

Although some of the foregoing examples describe a VCSEL, the present invention can be carried out in devices other than VCSELs. Those skilled in the art will recognize that the invention can be implemented in other light emitting diodes where injection of carriers from a wide bandgap material to a narrow bandgap material is needed. The injection structure can also be advantageously used with devices that do not have quantum wells. For example, the injection structure of the invention can be implemented with a heterojunction bipolar transistor, which includes a junction of wide bandgap material and narrow bandgap material.

The present invention also includes an injection structure on the p-side of a semiconductor device. An injection structure on the p-side of the semiconductor device is similar to the injection structures described above except that the dopant in the confining layer (including the doping in the transition region) is a p-type dopant. In addition, instead of positioning the aluminum inflection at or near an electron affinity minimum, the aluminum inflection occurs at a hole affinity maximum. As defined above, the hole affinity is the sum of the electron affinity and the energy bandgap. The hole injection structure can be used alone or in combination with the electron injection structure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A semiconductor device with efficient carrier injection from a wide bandgap semiconductor material into a narrower bandgap semiconductor material, the semiconductor device comprising:
    a first semiconductor material having a desired bandgap;
    an injection structure adjacent the first semiconductor material, the injection structure comprising:
        a confining region formed from a second semiconductor material having a wider bandgap than the first semiconductor material; and
        a transition region positioned between the first and second semiconductor materials, the transition region comprising a first ramp portion in which a composition is gradually ramped and a doped intermediate structure, the doped intermediate structure having an inflection in the ramping of the composition wherein (i) the intermediate structure is n-doped and the electron affinity at the inflection is lower than the electron affinity of the confining region or (ii) the intermediate structure is p-doped and the hole affinity at the inflection is higher than the hole affinity of the confining region, wherein the ramping of the composition comprises a change in the content of Al, P, or Si and the change in content of the Al, P, or Si provides an electron affinity minimum or a hole affinity maximum within the ramping and the inflection occurs at an Al, P, or Si content that is within 20% of the electron affinity minimum or the hole affinity maximum.

2. A semiconductor device as in claim 1, wherein the intermediate structure comprises a plateau in the ramping of the composition.

3. A semiconductor device as in claim 1, wherein the injection structure comprises a material selected from the group consisting of AlGaAs, AlGaInP, GaAsP, or SiGe.

4. A semiconductor device as in claim 1, wherein the inflection occurs at an aluminum content that is within 10% of the electron affinity minimum or the hole affinity maximum.

5. A semiconductor device as in claim 1, wherein the thickness of the confining region is in a range from about 5 nm to about 100 nm.

6. A semiconductor device as in claim 1, wherein the intermediate structure has a thickness in a range from about 5 nm to 100 nm.

7. A semiconductor device as in claim 1, wherein the doping in the intermediate structure is greater than about $5 \times 10^{17}/cm^3$.

8. A semiconductor device as in claim 1, wherein the dopant level in the confining region is in a range of about $5 \times 10^{17}/cm^3$ to about $1 \times 10^{19}/cm^3$.

9. A semiconductor device as in claim 1, further comprising a spacer layer adjacent the confining region and having an aluminum content that is less than the aluminum content of the confining region.

10. A semiconductor device as in claim 1, wherein the semiconductor device comprises an active region and the first semiconductor material is deposited in the active region.

11. A semiconductor device as in claim 10, wherein the transition region further comprises a substantially undoped portion that is adjacent the active region.

12. A semiconductor device as in claim 1, wherein the semiconductor device comprises a heterojunction bipolar transistor.

13. A semiconductor device as in claim 1, wherein the intermediate structure is n-doped and the electron affinity at the inflection is lower than the electron affinity of the confining region.

14. A semiconductor device as in claim 1, wherein the intermediate structure is p-doped and the hole affinity at the inflection is higher than the hole affinity of the confining region.

15. A semiconductor device as in claim 1, wherein the ramping of the composition in the ramp portion is substantially continuous and wherein the inflection comprises a discontinuity in the ramping.

16. A semiconductor device as in claim 1, wherein the semiconductor device comprises an active region and the first semiconductor material is a quantum well barrier in the active region.

17. A semiconductor device with efficient carrier injection from a wide bandgap semiconductor material into a narrower bandgap semiconductor material, the semiconductor device comprising:
    a first semiconductor material having a desired bandgap;
    an injection structure adjacent the first semiconductor material, the injection structure comprising:

a confining region formed from a second semiconductor material having a wider bandgap than the first semiconductor material; and a transition region positioned between the first and second semiconductor materials, the transition region comprising a first ramp portion in which a composition is gradually ramped and a doped intermediate structure, the doped intermediate structure having an inflection in the ramping of the composition wherein (i) the intermediate structure is n-doped and the electron affinity at the inflection is lower than the electron affinity of the confining region or (ii) the intermediate structure is p-doped and the hole affinity at the inflection is higher than the hole affinity of the confining region, wherein the inflection occurs at an aluminum content that is within 15% of the electron affinity minimum or the hole affinity maximum.

18. A semiconductor device with efficient carrier injection from a wide bandgap semiconductor material into a narrower bandgap semiconductor material, the semiconductor device comprising:

a first semiconductor material having a desired bandgap;

an injection structure adjacent the first semiconductor material, the injection structure comprising:

a confining region formed from a second semiconductor material having a wider bandgap than the first semiconductor material; and a transition region positioned between the first and second semiconductor materials, the transition region comprising a first ramp portion in which a composition is gradually ramped and a doped intermediate structure, the doped intermediate structure having an inflection in the ramping of the composition wherein (i) the intermediate structure is n-doped and the electron affinity at the inflection is lower than the electron affinity of the confining region or (ii) the intermediate structure is p-doped and the hole affinity at the inflection is higher than the hole affinity of the confining region, wherein the confining region comprises a second ramp portion in which the composition is ramped and wherein the doped intermediate structure having the inflection is between the first and second ramp portions.

* * * * *